United States Patent [19]

Keogh et al.

[11] Patent Number: 5,008,619

[45] Date of Patent: Apr. 16, 1991

[54] MULTILEVEL CIRCUIT BOARD PRECISION POSITIONING

[75] Inventors: Raymond J. Keogh, Huntington; Ronald Morino, Shelter Island Heights, both of N.Y.; R. Page Burr, Matinicus, Me.

[73] Assignee: AMP-AKZO Corporation, Melville, N.Y.

[21] Appl. No.: 272,929

[22] Filed: Nov. 18, 1988

[51] Int. Cl.$^5$ .......................... G01B 7/14; H05K 3/02; H05K 3/10

[52] U.S. Cl. .............................. 324/207.16; 324/226; 324/262; 29/846

[58] Field of Search ............... 324/207, 208, 226, 262, 324/207.11, 207.13, 207.14, 207.15, 207.16, 207.17, 207.22, 207.24; 336/115; 29/825, 830–832, 834, 846, 850

[56] References Cited

U.S. PATENT DOCUMENTS

| | | |
|---|---|---|
| 2,799,835 | 7/1957 | Tripp . |
| 2,867,783 | 1/1959 | Childs . |
| 2,878,445 | 3/1959 | Scarborough ........................ 324/208 |
| 2,915,722 | 12/1959 | Foster . |
| 2,924,798 | 2/1960 | Foster . |
| 2,994,051 | 7/1961 | Spencer et al. ..................... 336/115 |
| 3,064,218 | 11/1962 | Farrand . |
| 3,090,934 | 5/1963 | Farrand . |
| 3,202,948 | 8/1965 | Farrand . |
| 3,349,303 | 10/1967 | Burnight et al. ..................... 336/115 |
| 4,223,300 | 9/1980 | Wiklund . |
| 4,401,986 | 8/1983 | Trenkler . |

FOREIGN PATENT DOCUMENTS

| | | |
|---|---|---|
| 880727 | 2/1958 | United Kingdom . |
| 1469677 | 11/1974 | United Kingdom . |
| 1519938 | 3/1977 | United Kingdom . |
| 2086036A | 10/1980 | United Kingdom . |

Primary Examiner—Walter E. Snow
Attorney, Agent, or Firm—Morgan & Finnegan

[57] ABSTRACT

In a system for determining the relative position of a first object with respect to a second object, electrical detection of registration is achieved. This registration can be used during the manufacture of printed circuit boards or discrete wiring boards to determine the registration between layers of wiring, or between wiring layers and printed circuit layers. The system introduces an a.c. current at a suitable frequency into at least one first conductive pattern wired or etched or otherwise provided near the perimeter of a printed or wired first layer of a circuit board panel. The panel having the first pattern is moved relative to similarly wired second conductive patterns on a second layer or base plate, mounting table, etc., to which detection circuits are connected. Voltage induced in the second patterns is detected and indicates the positional relationship between the first and second conductive patterns and, hence, objects associated with such patterns. The system is well adapted for use in the manufacture of circuit boards, with errors between a distorted panel layer and the next succeeding layer may be evenly distributed or averaged to produce optimum results.

15 Claims, 7 Drawing Sheets

MULTILEVEL CIRCUIT BOARD PRECISION POSITIONING

TECHNICAL FIELD

The present invention relates to the manufacture of multilayer printed circuit interconnection boards or discrete wiring boards and, more specifically, to a method for positioning the various layers of such circuit boards during their manufacture.

BACKGROUND AND OBJECTS OF THE INVENTION

In the manufacture of multiple-level printed circuit boards, either multilayer printed circuit boards or discrete wiring boards, it is necessary to insure registration of each layer with respect to all others.

As an example, in either multilayer printed circuit boards or discrete wiring boards, the "signal" layers, i.e., those containing the pathways for the logical interconnections, must be registered with each other, with the power-ground format layers and the input/output/mounting pad layers. The connections between these layers usually are made by drilling through the boards at the desired interconnection points and then metallizing the drilled holes in order to form the interconnections. If the layers are not in accurate alignment, the drilled holes will not pass through the intended connection points, and may, in fact, pass through terminal points or conductors which are not intended to be connected to these outer layers.

Registration is normally provided by the inclusion in each layer of two or more optically located "tooling" or registration holes which are intended to fit accurately over a pair of corresponding pins having the same diameter as the drilled "tooling" holes. These "tooling" holes and pins are repeated on the work stations of each critical manufacturing tool, i.e., the pattern printer (if multilayer printed circuit boards), the wiring machine (if discrete wiring boards), and the drilling machine.

In the production of sequentially laminated multilayer printed circuit panels, the achievement of front-to-back registration of individual inner layers is not normally a problem. The glass or metal-based photoprinting tools usually have extremely high edge definition and contrast. As a result, the first-side tool for one layer can be optically aligned with the second-side tool with excellent accuracy. Both sides of the thin inner layers are then photoprinted at the same time and, therefore, it is only necessary that care be taken in set-up of the two-sided printer to achieve good inner-layer registration.

The real difficulty, and the operation which is prone to produce scrap, comes in stacking the individual layers prior to lamination. Material shrinkage or stretch or warp gives rise to this difficulty; the panels are opaque or translucent, so that optical registration using features common to all layers (e.g. termination pads), is not usually feasible. Normally this operation is carried out by including a series of "targets" on each of the layers, formed at the same time that the photoprinter exposes (creates) the doublesided image on each inner layer surface. These "targets" are subsequently used to locate "tooling holes" for the purpose of locating, in conjunction with corresponding "tooling pins", the layers in the correct position relative to each other during lamination.

The finished inner layers are then stacked in proper order, together with the required ground, power and component mounting-pad layers, and with interleaved prepreg layers, on pins located on an assembly jig, in preparation for the lamination step. Unfortunately, during their manufacturing process, prior to laminating, the layers are subjected to heat during (i) conductor formation, (ii) hole metallization steps, and (iii) removal by etching of most of the copper foil which had restrained movement of the thin dielectric core. These factors introduce considerable dimensional variation into the layers, and therefore the original tooling targets are not at the same locations that they were when they were first formed.

Each of the laminating "tooling holes" may be individually and precisely located in reference to their respective target, but the layer's dimensional changes, resulting from the aforementioned manufacturing stresses, may cause the holes to be mislocated and fail to match the position of the "tooling pins". Forcing the layers onto the pins is a common cause for layer-to-layer misregistration.

In one optical alignment system, several "targets" (e.g. one in each corner of the layer) may be optically sighted and used to achieve a compromise position of the layer in a punching or drilling tool which generates all the "tooling holes" in the correct position to each other but in a "best compromise" position in relation to the distorted layer. While this method is generally considered an improvement, and has been incorporated in commercial embodiments (for example, in the Opti-Line PE equipment manufactured by the Multiline Division of Lenkeit Corporation), it is subject to the shortcomings of the optical systems previously described. In addition, the "best compromise" position is subject to human variability, if done by an operator, or to the sophistication of the optical system and image positioning algorithm in the case of computer controlled optical systems.

In either case physical and optical variations of the "targets" occur to some degree. These variations may be related to:
Size
Reflectivity
Contrast to background
Form definition
In addition, these variations may occur:
Within a target
Among targets on the same layer
On targets residing on different layers.

As a result of these variations, the "best compromise" perceived by either an operator or arrived at as a result of processing optically derived data does not necessarily coincide with the "best geometrical compromise".

Optical work positioning systems are suitable for many applications. In other applications, however, optical systems have been used because of the lack of available alternatives, but they present serious shortcomings. These shortcomings include (1) insufficient depth of field at the magnification needed to achieve the desired resolution, e.g., magnification of at least 100X is required for a resolution of about 0.0005 inch (0.0125 mm); (2) high cost due to the need for at least two expensive devices at each work station to define the geometrical position of features on one plane; (3) difficulty in mounting the optical devices on operating machines in a sufficiently rigid manner to retain the precise reference position intended in the presence of vibration and acceleration/deceleration; (4) the need for the operator to alternatively view two targets (on two optical devices), in order to effect the workpiece position, in an iterative manner, or, alternatively, the need of complex and expensive optical or television systems to accomplish the task non-iteratively; (5) the inability to access images (features) on the face resting on a machine table (down face) as necessary, for example, when a second side of an opaque panel has to be wired in registration with the first side; (6) the difficulty in averaging out or symmetrically splitting dimensional errors of the workpiece; and (7) the need for high optical contrast targets.

While the layer-to-layer registration errors attributable to these factors are generally acceptable for process tolerances of a few mils (tenths of a mm), they become intolerable in processing more advance, denser designs where the acceptable registration tolerances are in the vicinity of one mil (0.025 mm) and preferably lower.

Looking at the manufacturing process for a typical two-level wiring discrete wiring board, there are four critical operations where precision is required: (1) first side-to-side voltage plane/ground plane (format) registration; (2) side wiring to voltage/ground plane registration; (3) second side to first-side wiring registration; and (4) drilling to wire pattern registration.

The manufacture of the two-sided format comprising a voltage plane and a power plane involves conventional two-sided photo print image formation. Good two-side photo printers have been available for many years. The desired precision in this operation is readily achievable because of the transparency of the base film and the high optical contrast between this base and the photoimage formed thereon.

Wiring-to-format and wiring-side-one to wiring-side-two registration are characterized in that individual layers of features are generated in separate operations. Moreover, as each layer is produced the previous layer is not optically visible. For example, the step of registering the wiring to the format is "blind" because the underlying opaque format is covered by opaque or translucent adhesive. Similarly, when wiring the second layer, the first layer is face down on the table and cannot be used as a visual reference. The conventional way of performing this operation, i.e., using pins and matching holes in the panel, has certain flaws. These flaws include inaccuracies in pin/hole fit, material shrinkage or deformation and misadjustment in position of the pins with respect to the wiring head and/or x-y axis travel.

In spite of the considerable efforts that have been expended to insure registration of the layers throughout the manufacturing sequence, misregistration caused by errors in the tooling hole location or size, and/or material stretch or shrinkage remains a significant reason for the rejection of these multiple layer boards. As board size and interconnection density rises, this problem becomes even more serious.

Accordingly, it is the object of the present invention to provide a simple and accurate method of registering the various layers of either multilayer printed circuit boards or discrete wiring boards during their manufacture.

It is a further object of the present invention to provide a method of registering the various layers of either multilayer printed circuit boards or discrete wiring boards which is substantially free of tooling hole location or size defects and material stretch or shrinkage problems.

The present invention provides a solution to the shortcomings associated with the prior art mechanical or optical sensing systems described above.

SUMMARY OF THE INVENTION

In the manufacture of both printed and discrete-wiring boards, feature size and spacing exhibit a continuing trend towards miniaturization. The packing together of components having more input/output pins on closely spaced centers demands increased precision in all of the mechanical steps of board manufacturing. The present invention is directed towards techniques for electrically determining the position of layers of such wiring boards relative to one another, or to a reference, to insure precision during manufacturing. The present invention, however, is not limited to the manufacture of such circuit boards but is broadly applicable to the positioning of one object relative to another.

In one embodiment, identical simple patterns are wired or otherwise formed as electrical conductors on two surfaces to be registered. A power amplifier driven by a sine-wave generator applies an alternating current of a convenient frequency to a first or driver pattern of a first layer. A high gain amplifier is connected across the second or detector pattern of the second layer. The two superimposed layers are moved relative to one another, translated in orthogonal axes and rotated relative to one another until an oscilloscope or meter connected to the output of the high gain amplifier provides a maximum reading, indicating that optimum registration has been achieved.

In a second embodiment, a different type of arrangement is used, in which a null is sought. The components used in the second technique are nearly identical to those of the first technique except that the detector pattern includes a hairpin shaped loop and the output of the power amplifier is coupled to the horizontal sweep of the oscilloscope. This produces a more sensitive indication in that the change in voltage per incremental change in position ($\Delta E/\Delta X$) is very rapid in the vicinity of registration. A very sensitive visual indication is obtained by coupling the output of the power amplifier to the horizontal sweep of the oscilloscope and examining the resultant Lissajous pattern. The rapid phase-shift of the output signal relative to the input is observed, such that at the null, the elliptical pattern on the oscilloscope screen degenerates to a horizontal line. The pattern of the oscilloscope screen is significantly different when registration is only very slightly removed from the null position.

In these embodiments for determining the relative position of at least a first object with respect to a second object, the apparatus comprises a first geometric pattern of conductive material disposed on the first object and a second geometric pattern of conductive material disposed on the second object. The two objects are juxtaposed such that the perpendicular projection of the pattern on the first object is centered on, within, or in the near vicinity of the second geometric pattern. Means are provided for applying a predetermined value of alternating current to the first pattern to establish an electromagnetic field surrounding this pattern, and means are also provided for detecting the magnitude of the voltage induced in the second pattern by the field established by the first pattern. The position of the first object relative to the second can be manipulated to achieve optimum registration, which is indicated by the magnitude of the induced voltage detected by the detecting means.

Since the detected electronic signal changes in both phase and magnitude as one object is moved relative to the other, the invention may be used to implement a completely automatic assembly station for producing multilayer circuit boards as follows:

A stack of panels comprising the individual layers for a multilayer circuit board are loaded, one at a time, by a panel handling conveyor or robot. Each panel in its turn is manipulated, for example, by a three-axis servo drive table until the detected signals from the sensors produce zero, or, at least, minimum error signals to the three servo-driven axes. At this point, a set of punch/drilling units are energized to form tooling holes in the panel. The panel-handling robot then transfers the panel stack to the laminating station in preparation for the laminating operation.

DETAILED DESCRIPTION OF THE PREFERRED EMBODIMENTS

Figure 1:
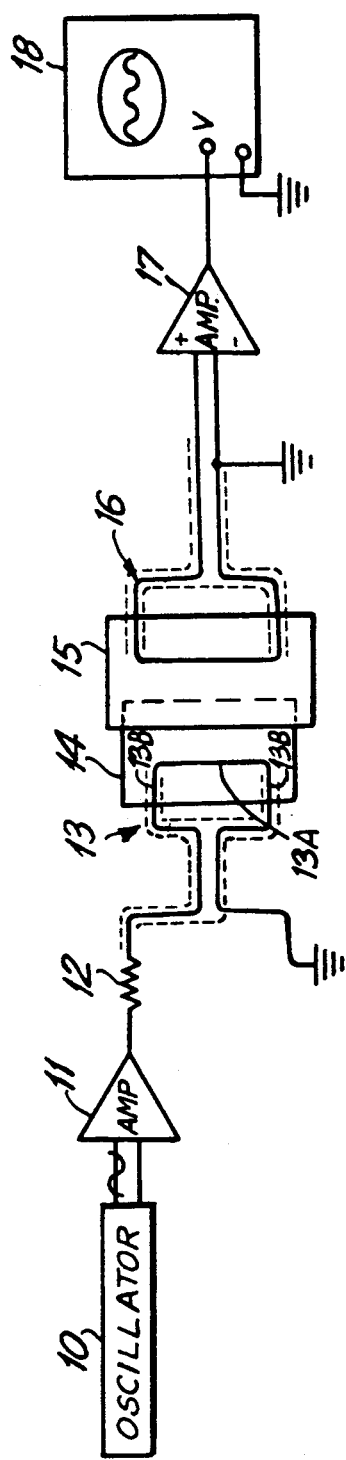
FIG. 1 is a schematic diagram of a first embodiment of the present invention.

Referring now to the drawings, the present invention will now be described in the context of manufacturing multilayer printed circuit boards and discrete wiring boards. It will be understood, however, that the present invention is not limited to these particular applications and may find broader use in practice.

Figure 2:
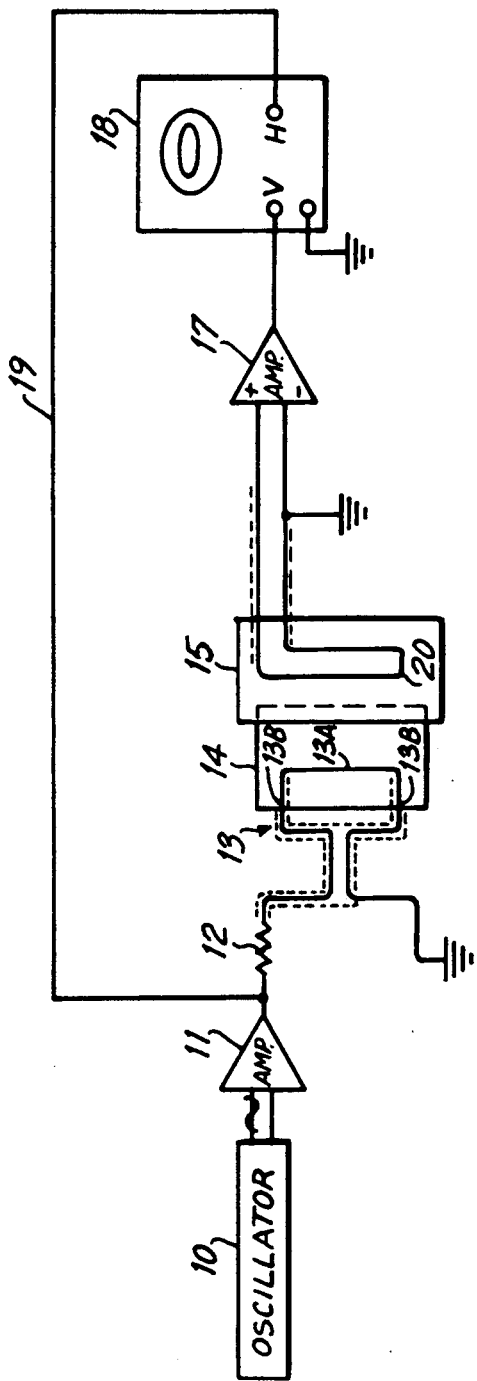
FIG. 2 is a schematic diagram of a first alternative embodiment of the present invention.

FIGS. 1 and 2 show in schematic form two techniques for detecting the relative position of either etched or wired conductor patterns 13, 16 on panels 14, 15, which may be individual layers of a multilayer circuit board. The patterns 13, 16 are formed on separate panels 14, 15 and may be moved relative to one another. In FIG. 1, an oscillator 10 drives the input of a small power amplifier 11. The amplifier 11, in turn, drives a resistor 12 that is connected in series with the first pattern or "driver coil" 13 on panel 14. In the embodiment shown in FIG. 1, the first pattern 13 is simply a single straight-wire on line 13A with connecting leads 13B. The current delivered to driver pattern line 13 gives rise to an electromagnetic field uniformly surrounding the first pattern and varying in amplitude in synchronism with the frequency of the oscillator 10. This frequency is preferably selected to be some convenient value in the range of ten to one hundred kilohertz.

Figure 1A:
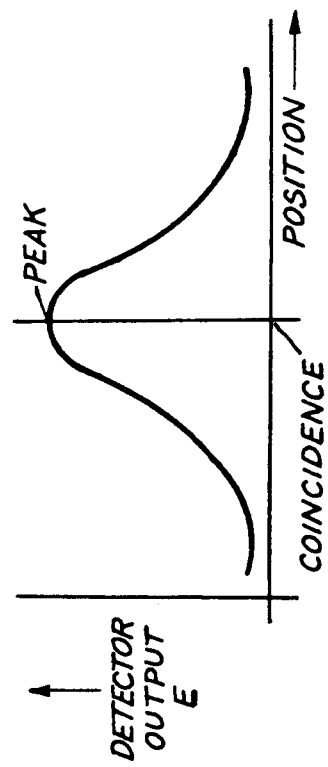
FIG. 1A is a diagram associated with the embodiment of FIG. 1, showing the variation in amplitude as the two patterns are displaced relative to one another.

The second layer 15, which includes the second or "detector" pattern 16, is superimposed over the first layer 14. The second pattern 16 has its ends connected to the input terminals of a low noise, high gain amplifier 17. The output of amplifier 17, in turn, is connected to the vertical input terminals of an oscilloscope 18 or to a sensitive AC voltmeter. As the position of panel 15 is adjusted relative to panel 14, the electromagnetic field resulting from passage of the alternating current through line 13 cuts through the line 16 and induces a voltage in this pattern whose amplitude is inversely proportional to a function of the horizontal distance separating the two patterns. As panels 14, 15 are moved relative to one another to bring the two patterns 13, 16 into close alignment, the trace of oscilloscope 18 will rise to a peak value as shown in the diagram of FIG. 1A. Of course, the oscilloscope trace will decay from peak value as the patterns 13, 16 move away from coincidence.

FIG. 2 shows a first alternative embodiment of the invention shown in FIG. 1. In the embodiment of FIG. 2, the detector pattern 20 on panel 15 has been changed from a line to a loop pattern 20 with two elongated parallel sides, or legs. One end of the detector loop pattern 20 is connected to the inverting terminal of amplifier 17, with the other end of loop 20 connected to the non-inverting terminal of amplifier 17. In addition a source sampling wire 19 has been connected directly from the output of power amplifier 11 to the horizontal sweep input terminal of the oscilloscope 18. As before, the alternating current passing through the driver pattern 13 induces a cylindrically shaped electromagnetic field which rises to a peak in one direction, passes through zero and rises to a peak in the other direction in synchronism with the alternating current frequency. As boards 14, 15 are moved relative to one another, the voltage induced in each of the two elongated sides of the loop pattern 20 will be unequal until the projection of the drive wire, 13, on the plane of pattern 20 exactly bisects the loop. Because the oscilloscope beam is caused to deflect in a horizontal direction in synchronism with the output frequency of the oscillator 10, as layers 14, 15 are moved away from alignment a circular or elliptical pattern appears on the display of oscilloscope 18. As the two patterns 13, 20 move closer together, the ellipse exhibits a rapid rotation of the major axis (phase shift) simultaneously with a rapid reduction in the length of the minor axis. The direction of rotation of the ellipse will reverse as the relative direction of motion along the displayed axis is reversed. The inclination of the ellipse with respect to the horizontal and vertical axes of the oscilloscope will be determined by the direction of the error. By way of example only, the major axis of the ellipse will lie along an imaginary line passing through the second and fourth quadrants if the misregistration of the second pattern relative to the first is to the left, whereas the major axis will lie along an imaginary line traversing the first and third quadrants if misregistration is to the right.

Figure 2A:
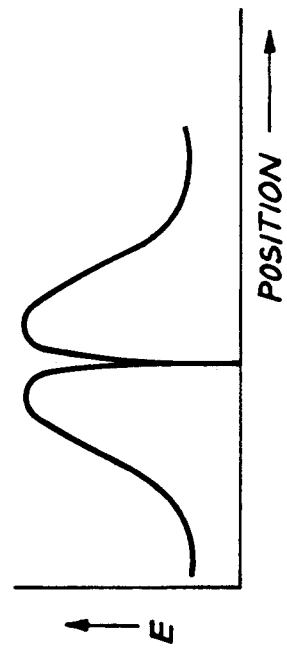
FIG. 2A is a diagram associated with the embodiment of FIG. 2, showing the amplitude variation as the two patterns are displaced relative to one another.

The qualitative plot shown in the waveform of FIG. 2A shows that there is a position where the output of the detector or oscilloscope 18 goes through a deep null, with a very rapid rise on either side. At the null position the oscilloscope 18 shows only a horizontal line as the ellipse collapses. At this null point, the driver pattern or wire 13 is exactly centered between the two wires of the detector loop pattern 20, and the phasing of these two equal signals results in zero net signal to the detector amplifier circuit 17. Hence, no input is generated to the vertical input terminal of the oscilloscope 18 and a horizontal line is displayed. For this null type pattern the display of oscilloscope 18 detects the balance position with a repeatability of 100 millionths of an inch (0.0025 mm) or better, limited only by the signal to noise ratio of the available detector amplifiers.

Other display methods, such as a set of one or more light emitting diode ("LED") light bars are also contemplated. By way of example only a very effective, low-cost alternative to the oscilloscope display is the light bar display. This unit comprises a row of light-emitting diodes (LEDS) or other fast-acting light producing elements arranged in a linear array. The amplified detector signal for each axis is rectified and applied to the input of a logarithmic amplifier. The output of this amplifier drives the display in such a manner that the length of the bar (the number of illuminated LEDS) is proportional to the log of the misregistration distance in that axis. The display is arranged so that as the null position is approached, for example, the single illuminated LED represents 0.0001 inch (0.0025 mm) misregistration; 10 LEDS represent 0.001 inch, (0.025 mm) and 20 LEDS represent about 0.020 inch (0.5 mm) misregistration in that axis. Three such bars side by side allow the operator to observe and quickly correct translation and rotation of the manipulated panel to achieve optimum registration.

Figure 3A:
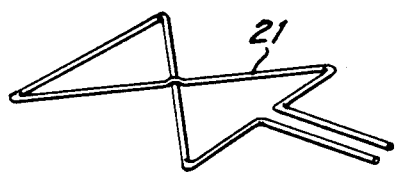
FIG. 3A is an illustration of a driver coil in accordance with a second alternative embodiment of the invention.
Figure 3C:
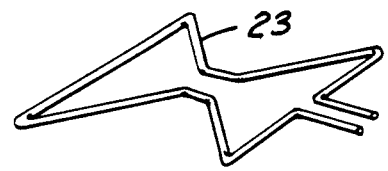
FIG. 3C is an illustration of a driver coil in accordance with a third alternative embodiment of the invention.
Figure 3B:
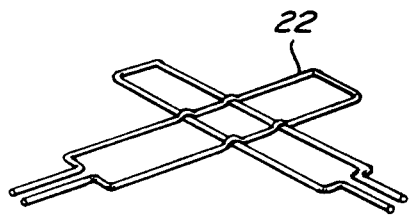
FIG. 3B is an illustration of a detector coil associated with the driver coil of FIG. 3A.
Figure 3D:
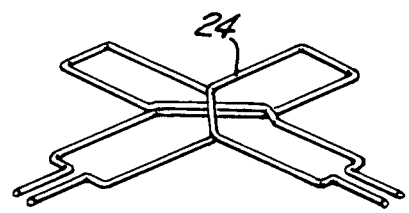
FIG. 3D is an illustration of a detector coil associated with drive coil of FIG. 3C.

Referring now to FIGS. 3A-3D, second and third alternative embodiments of the invention include driver and corresponding detector patterns which permit simultaneous registration in two orthogonal directions. The patterns 21-24 can be approximately one square inch (600 mm$^2$), and detector patterns, 22, 24 may consist of two elongated loops 0.1 inch (2.5 mm) in width. The pattern 21 of FIG. 3A is a driver coil in a bow-tie shape, or in the shape of a pair of triangles joined at an apex of each respective triangle, which may be formed from insulated wire. The overlapping loop pattern 22 of FIG. 3B is a detector coil well suited for use with the driver pattern of FIG. 3A, and likewise may be formed of insulated wire. The pattern 23 of FIG. 3C is a driver coil which may be formed from an etching process or printed with conductive ink, and the pattern 23 of FIG. 3D is a substantially rectangular-shaped detector coil well suited for use with the driver pattern of FIG. 3C.

Both halves of the patterns 21, 22 shown in FIGS. 3A and 3B use crossed insulated wires and are, therefore, suitable for registering one wire layer to another in a discrete wiring board. Because of the crossover, the pattern 21 is not convenient for registration of etched patterns, in either the etched power or ground format of a discrete wiring board or etched conductor patterns in a printed circuit board. To form the crossovers would require two layers of an etched or conductive ink pattern, plus conductive connection via holes, to avoid shorting of the uninsulated conductors at the point where they cross. A relatively small modification of the driver pattern 21 of FIG. 3A results in the pattern 23 of FIG. 3C, a bow-tie shape, or a pair of triangle-shaped FIGURES, joined at an opened apex, which is suitable for economical inclusion as part of the etched or plated format. A modification of the crossover detector pattern 22 of FIG. 3B is required for use with the driver pattern 23 in order to preserve the phasing. Each loop, therefore, is divided in half and wired as shown as rectangular-shaped coils in FIG. 3D. The modified pattern pairs 23, 24 shown in FIGS. 3C and 3D, work equally as well as those of FIGS. 3A and 3B.

Note that the method does not require that the driving pattern and the detector pattern be coplanar, only that they be on adjacent, parallel planes. As the distance between the planes is increased, the detected signal gets correspondingly weaker with attendant loss in discrimination of exact registration. Separation is preferably on the order of 0.1 mils to 100 mils (0.0025 mm to 2.5 mm), more preferably less than 40 mils (1 mm) and most preferably less than 20 mils (0.5 mm).

Figure 4:
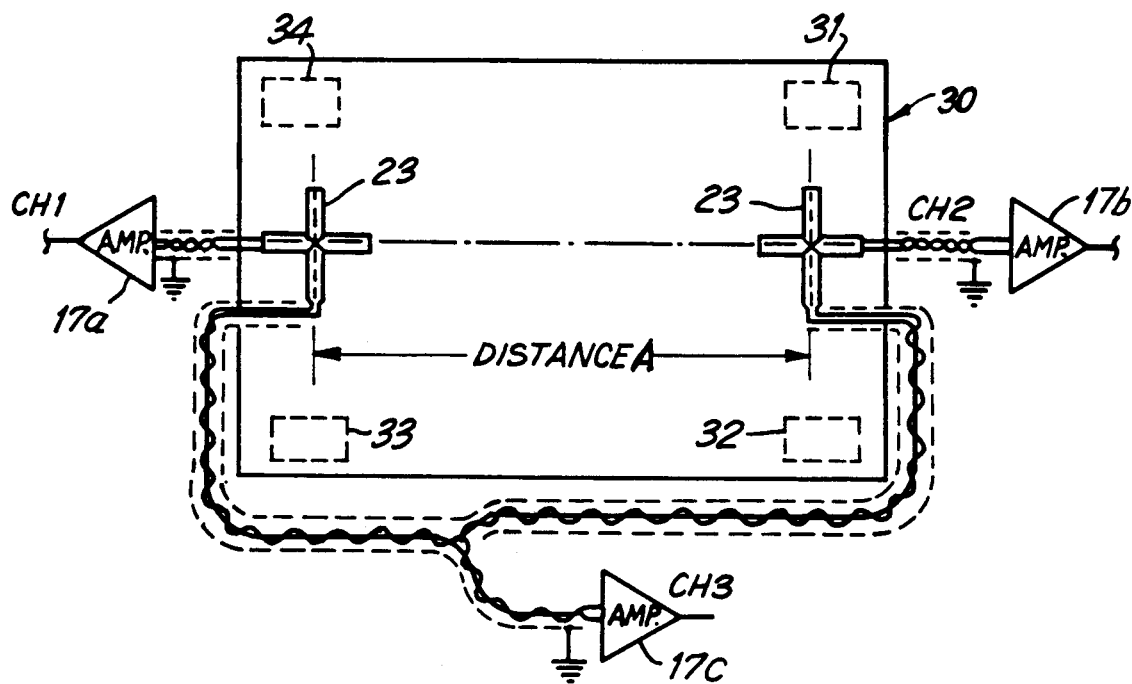
FIG. 4 is an illustration of a panel having the detector coils of FIG. 3D disposed thereon.
Figure 5:
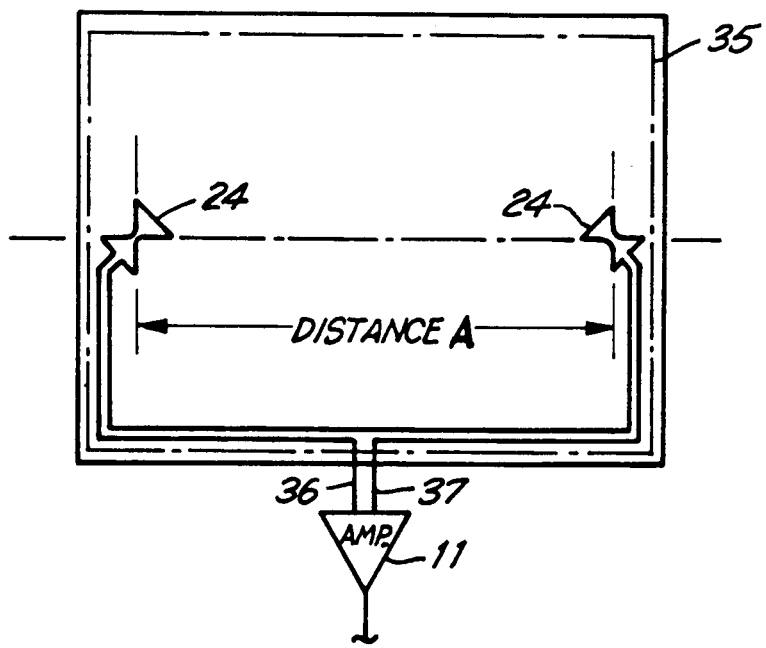
FIG. 5 is an illustration of a panel having a pair of driver coils of FIG. 3C disposed thereon.

It should also be noted that the patterns of FIGS. 3A to 3D have been designed to minimize the effect of the connecting wires. The electromagnetic field surrounds all of the conductor carrying the alternating current to the driver pattern. Its effect must be minimized except in the vicinity of the pattern(s). This is accomplished by keeping both feed conductors in close proximity to one another and shielding the conductors connecting the detector patterns to their respective amplifiers as shown in FIGS. 5 and 4 respectively.

The following example illustrates application of the invention to the process of manufacturing multilayer printed circuit boards.

Figure 6:
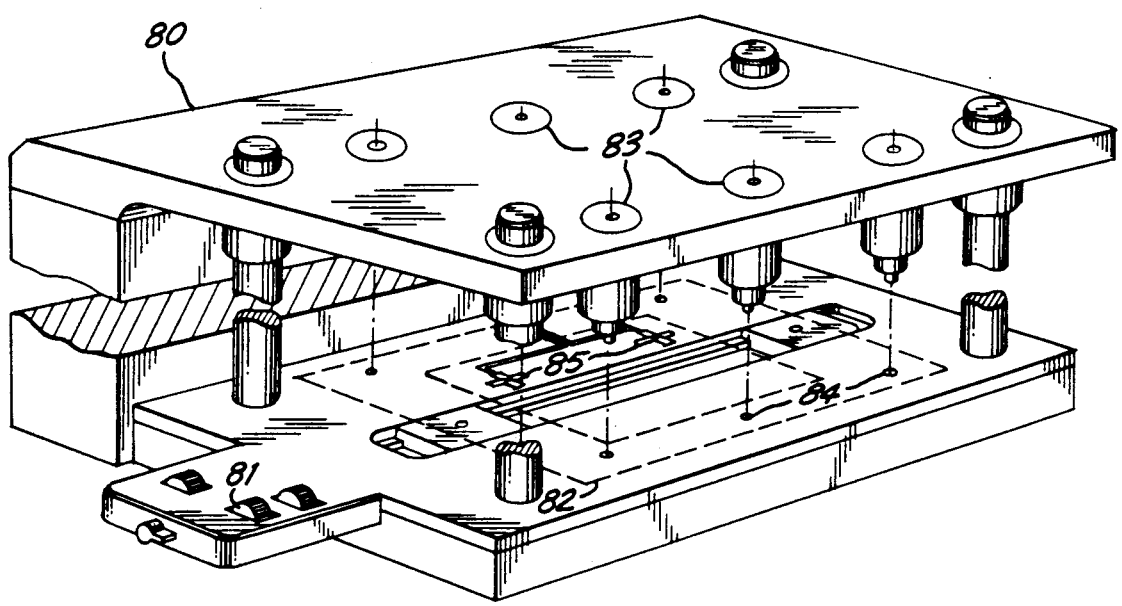
FIG. 6 is an illustration of a hole-forming fixture using the principles of this invention to manufacture multilayer boards.

Instead of using optical targets, as in prior art, this invention creates a two-axis electromagnetic registration pattern integral with the circuit image on each layer by the addition of, for example, two or more of the patterns illustrated in FIG. 3C. This pattern complements a second (reference) pattern affixed to a hole-drilling station (or hole-punching station) especially configured for this purpose shown in FIG. 6. This hole forming station 80 has, integral with it, a precision manipulation stage, 81, which facilitates very fine two-axis translation and rotation of the panel placed on it so that the two-sided layer 82 (shown in phantom) can be precisely registered to the reference target(s) 85 on the hole forming station. A composite display, such as the oscilloscope or LED displays previously described, indicates when precise registration is achieved. Even if the layer has shrunk or expanded, it can easily be discerned when the best possible registration of the layer to the reference pattern has been achieved. Misregistration of the layer to the reference on the order of 0.1 mil (2.5 microns or 100 millionths of an inch) is readily detectable on the display. When registration has been achieved, a multiple punch and die set (or a bank of drill heads) 83 is actuated to produce alignment holes 84 corresponding to the positions of expandable pins located in the assembly fixture. Since there are no stress-producing operations between the steps of making the alignment holes in the individual layers and the actual operation of stacking/laminating, the excellent final registration is obtained.

An additional feature of this invention is the fact that the integrated output signal permits the "best possible" registration of those cases wherein shrinkage, stretch or warpage of a layer has occurred. The layer is manipulated relative to the reference pattern in order to seek the best simultaneous "null" condition corresponding to the best compromise position for that particular layer. As will be readily appreciated, the "best compromise" is obtained prior to creating registration holes and stacking/laminating. Advantageously, if the "null" is poorer than a specified threshold, that layer can be rejected and replaced before a costly reject multilayer is produced.

Figure 7:
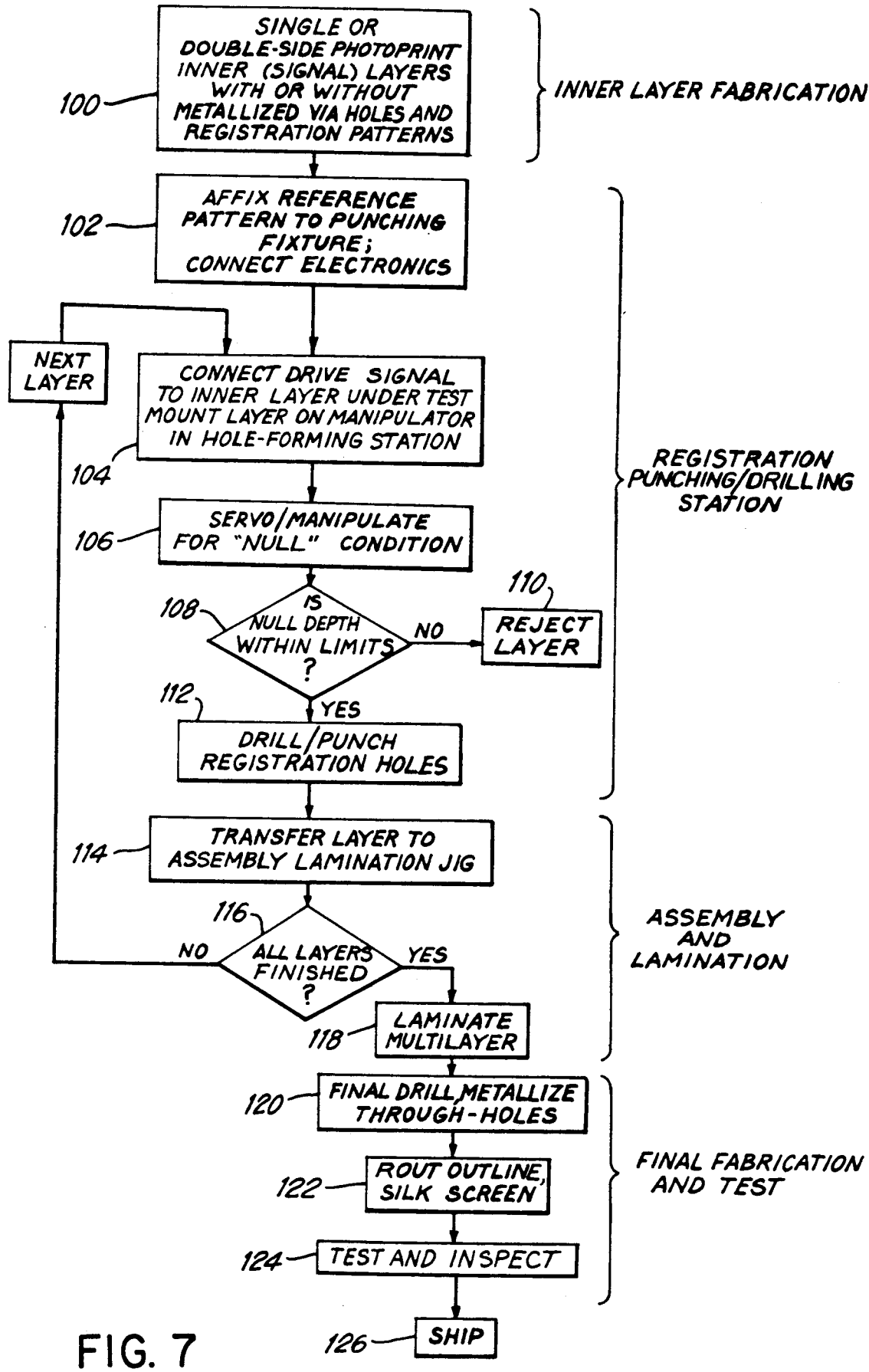
FIG. 7 is a flow chart detailing the steps of manufacturing multilayer boards using this invention.

The flow chart of FIG. 7 illustrates the steps involved in practicing this registration method to fabricate circuit boards. During inner layer fabrication (step 100), single or double photoprint inner signal layers, with or without metalized via holes, are prepared. Registration patterns in accordance with the invention are created on each layer of the circuit board to be assembled. In FIG. 7, registration and hole formation is performed in steps 102 through 112. At step 102, the reference pattern is affixed to the punching or drilling fixture and connected to drive and detection electronics. This step need only be performed during initial set-up of the assembly process. The drive and detection electronics is then connected to the inner layer under test and the layer is mounted on the manipulator of the hole forming station (step 104). The manipulator is mechanically or electrically operated until the appropriate display signal, such as the preferred "null" signal is obtained (step 106). The null signal obtained is compared to present null signal tolerance limits (step 108) and, if the null signal is not within tolerance, the particular inner layer under test is rejected prior to inclusion in a multiple layer board (step 110). Where, on the other hand, the null signal is within tolerance, alignment holes are formed in the layer, as by drilling or punching (step 112). Layers with alignment holes are transferred to the assembly lamination jig until all layers are prepared (steps 114 and 116). Steps 104 through 116 are repeated for each consecutive layer until all layers are complete, whereupon the multiple layers aligned by registration pins on the assembly jig are laminated to form a laminated multiple layer board (step 118). Final finishing steps, such as formation and metalization of drill through connections (step 120), routing outline and silk screening (step 122), testing and inspection (124) are performed and the multiple layer circuit board is shipped (step 126).

The method of the present invention finds application to both multilayer printed circuit boards and discrete wiring boards. However, in discrete wiring one of the most difficult problems in relating the position of the table, the format panel affixed to it and the wiring pattern scribed by the head arises from the nature of the scribing process itself. In the discrete wiring head a wire dispensing means feeds wire to a narrow slot machined in the tip of the bonding stylus. The position of this slot uniquely determines the precise position of the wire after bonding, but because of design requirements and necessary clearances between the groove width and the wire, it is extremely difficult to ascertain the exact point where the bonding takes place. The critical step in overcoming this difficulty is to make each wiring head generate its own "signature" as to where it will place its wires on the adhesive coated reference plane attached to the machine table and to use the reference pattern so generated (the "signature") as part of the registration system described in this invention.

The steps of an appropriate signature method, which may be applied to the manufacture of discrete wiring boards to obtain format-to-format and wiring-layer-to-wiring-layer registration, are described below with reference to FIGS. 4 and 5. FIG. 4 illustrates a wiring adhesive panel 30 which is used in the method, and FIG. 5 illustrates a format panel 35 which is also used.

Step 1: Using a conventional discrete wiring machine loading station, place a shuttle plate for head number one in position on the station. A "loading station" is a fixture which has precision locating means for accurately and repeatably holding a "shuttle plate", which is a transfer fixture on which a workpiece (e.g. wiring format) panel is secured. "Shuttle plates" are so called because they are used alternatively, in pairs, for each work station in the wiring machine. One plate carries the panel which is currently being wired, while its identical twin is undergoing the loading or unloading operation, off line. The loading station contains the signal generator, detector and display electronics of the present invention, together with a precision manipulator to translate and rotate the workpiece to effect registration using the method of this invention.

Step 2: Secure a piece of wiring adhesive 30 to the shuttle plate using strips 31–34 of thin two-sided tape in the four corners, as shown in FIG. 4.

Step 3: Place the wiring adhesive 30 and shuttle plate in position under head number one of the wiring machine.

Step 4: Wire two pairs of detector patterns 23 on the shuttle plate and wiring adhesive 30, with the center to center distance A of the patterns 23 corresponding to the nominal spacing of the etched patterns 24 formed on the format panel 35 (see FIG. 5).

Step 5: Return the shuttle plate and wiring adhesive 30 to the loading station of the wiring machine and connect the three detector amplifiers 17a, 17b, 17c to the patterns 23, as shown. The outputs of the three amplifiers are connected to three channels CH1, CH2, CH3 of a multi-channel oscilloscope.

Step 6: Place the adhesive coated format panel 35 on the shuttle plate in approximate registry with the detector patterns 23, with the first wiring side up. Connect the driver power amplifier 11 to wires 36, 37 of the driver patterns etched or conductive-ink printed on the second wiring side pattern of the panel 35, i.e., the side facing the shuttle plate.

Step 7: With a manipulator device, adjust the panel 35 until a null condition is observed for all three amplifiers 17a, 17b, 17c. Securely fasten panel 35 to the shuttle plate.

Step 8: Return the shuttle plate to the wiring machine, head number one station. Wire the first wiring layer on to the panel 35, including a second pair of driving patterns identical to those etched in the format.

Step 9: Return the shuttle plate to the loading fixture, unfasten the wiring panel 35, disconnect the two driver wires 36, 37, and reconnect them to the newly wired driver pattern formed on first wiring side.

Step 10: Flip the panel 35 so that the second wiring side is uppermost.

Step 11: Using the manipulator, again obtain null indications for the three channels CH1, CH2, CH3 and tape the panel 35 in place.

Step 12: Return the shuttle plate to the wiring head station of the wiring machine.

Step 13: Wire the second wiring layer, completing the wired pattern formation. Remove the panel 35 from the shuttle plate.

Only steps 6 through 13 have to be repeated for each panel 35 of the same job and/or each panel 35 for any job that has etched driver patterns spaced at distance A. It should be noted that so long as the head is not disturbed, its wiring signature is fixed in the adhesive layer attached to its shuttle plate. If the head is realigned or otherwise disturbed, steps one through five must be repeated. The use of this technique, which permits simultaneous observation of the effects of movement in three coordinates, gives the operator a fast, easy, adaptive method of compensating for errors arising from panel shrinkage, artwork errors, wiring machine positional errors, and head alignment errors. The technique can be expanded through the use of four such patterns, one located near each corner of the panel to compensate for even such difficulties as keystone distortion of the artwork.

Figure 8:
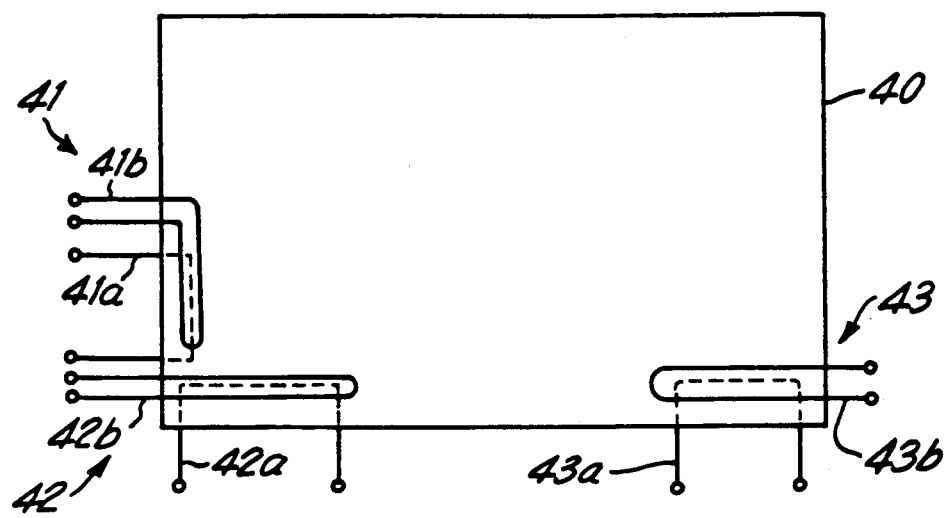
FIG. 8 is an illustration of a fourth alternative embodiment of the invention including two superimposed flat panel having driver and detector coils disposed thereon.

A fourth alternative embodiment of the present invention is illustrated in FIG. 8. This technique will now be described in the context of a workpiece, but is equally applicable to the manufacture of discrete wiring boards or printed circuit boards. The unique position of a workpiece 40 in one plane may be completely defined relative to a reference position by three sensors 41, 42, 43 of the type described above and illustrated in FIGS. 1 and 2. The sensors 41, 42, 43 include driver coils 41a, 42a and 43a (shown in part in phantom) and detector coils 41b, 42b and 43b. The positioning of the essentially flat workpiece 40 in one plane represents the most common application of this embodiment, but the embodiment is not limited to this particular application.

Sensors 41, 42, 43 in any desired number may be arranged on any desired plane to achieve spatial position sensing and control of objects of any configuration. Furthermore, the placement and the sensitivity of the sensors 41, 42, 43 may be selected to achieve different levels of positioning precision on different planes or different parts of the workpiece. The cautions pertaining to placement and shielding of the connecting leads mentioned previously will apply to this and the following example as well.

Figure 9:
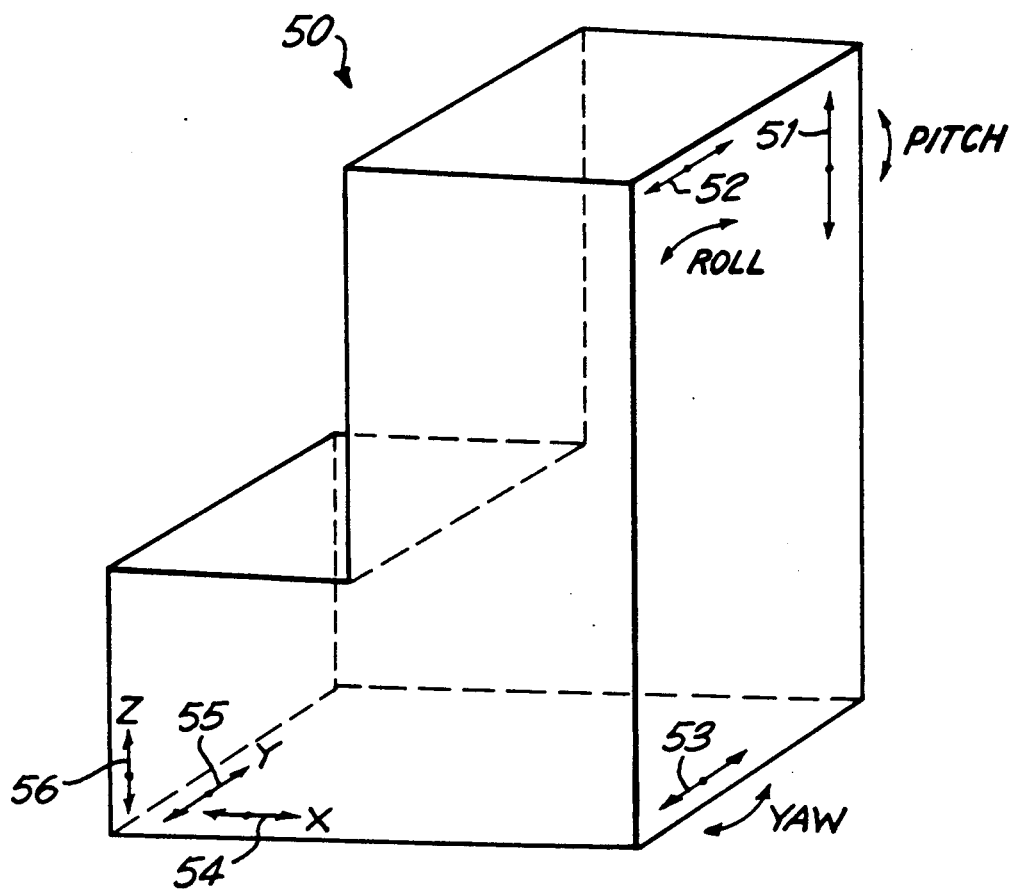
FIG. 9 is a perspective view of an irregularly shaped three dimensional object.

Referring now to FIG. 9, it can be appreciated that the unique spatial position of a three-dimensional workpiece 50 (or any geometrical solid) requires a minimum of three planes. Preferably, six sensors are located in the vicinity of vectors 51-56 in order to sense relative movement of these locations in the direction of the vectors. Sensors located generally in the vicinity of vectors 54, 55, 56 define a reference corner having X, Y, and Z axes. Three other sensors located in the vicinity of vectors 51, 52, 53 can be positioned to control yaw, pitch and roll, respectively.

The present invention is particularly effective and simple to implement when applied to a machine that can use its normal operating capability to generate its own sensors. Wiring machines used in the manufacture of discrete wiring boards have this capability. The "position signature" obtained from such a machine is inherently immune to externally induced errors or to the inevitable errors which result from the transfer of locating devices (probes, pins, etc). Since the "position signature" of a wiring head can be updated by simply removing from the table the "old" sensors and wiring new ones, the problem may be controlled without delicate, time consuming and less accurate mechanical adjustments. The concept of machine "position signature" may have significant implications in applications requiring extreme positioning precision of the type encountered, for example, in complex semiconductor manufacturing.

The present invention is also applicable to drilling machines. Most modern printed circuit board drilling machines may be programmed to rout or, in effect, to end mill the patterns or coils of the present invention into copper clad insulating materials used in printed circuit board manufacturing.

Figure 12A:
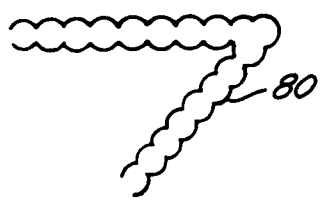
FIG. 12A is an illustration of a series of overlapping drilled holes forming a groove in a sheet of dielectric material.
Figure 12B:
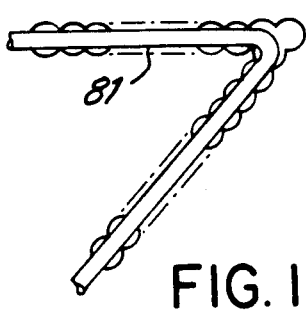
FIG. 12B is an illustration of a wire inserted in the groove of FIG. 12A.

Alternatively, for drilling machines which cannot be programmed for routing, a channel having the desired pattern (similar to FIG. 3C) can be generated in a sheet of dielectric material affixed to the drilling table. This may be done by drilling shallow overlapping holes (80), as shown in FIG. 12A. The hole diameter, spacing and depth of drilling are selected to be compatible with the chosen wire diameter. As an example, a number 24 AWG film-coated wire has an overall diameter which measures 0.026 inch (0.66 mm). A series of holes drilled with a number 60 drill (0.040 inch or one mm), spaced on 0.030 inch (0.75 mm) centers, and 0.026 inch deep will firmly grip and accurately locate this wire (81) inserted in the "groove", as shown in FIG. 12B. This drilled pattern will directly provide the desired "drilling head position signature" for this machine.

When drilling a panel that has wires located with small deviations from their intended position, it is advantageous to average such deviations in order to minimize, at any one point, the mismatch between existing wires and holes to be added. Since with the present invention the sensors are part of the workpiece their position deviation is the same as that of the wires. If the panel is positioned in such a way that the sensors are symmetrically offset by equal amounts in order to average the position deviation of the other panel features, thereby reducing any mismatch. This averaging process may be accomplished with two instrumentation techniques illustrated in FIGS. 10 and 11. The techniques of FIGS. 10 and 11, constituting fifth and sixth alternative embodiments of the invention also advantageously reduce the number of connections which must be made to the sensors. This is an important consideration, for while the making of electrical connections to a permanent sensor located on a machine table is a relatively simple task, the making of a number of electrical connections to a workpiece may be objectionable in some applications. It is desirable, therefore, to reduce the number of connections on the workpiece by designing a common driver circuit for all the sensors and serially connecting these driver coils.

Figure 10:
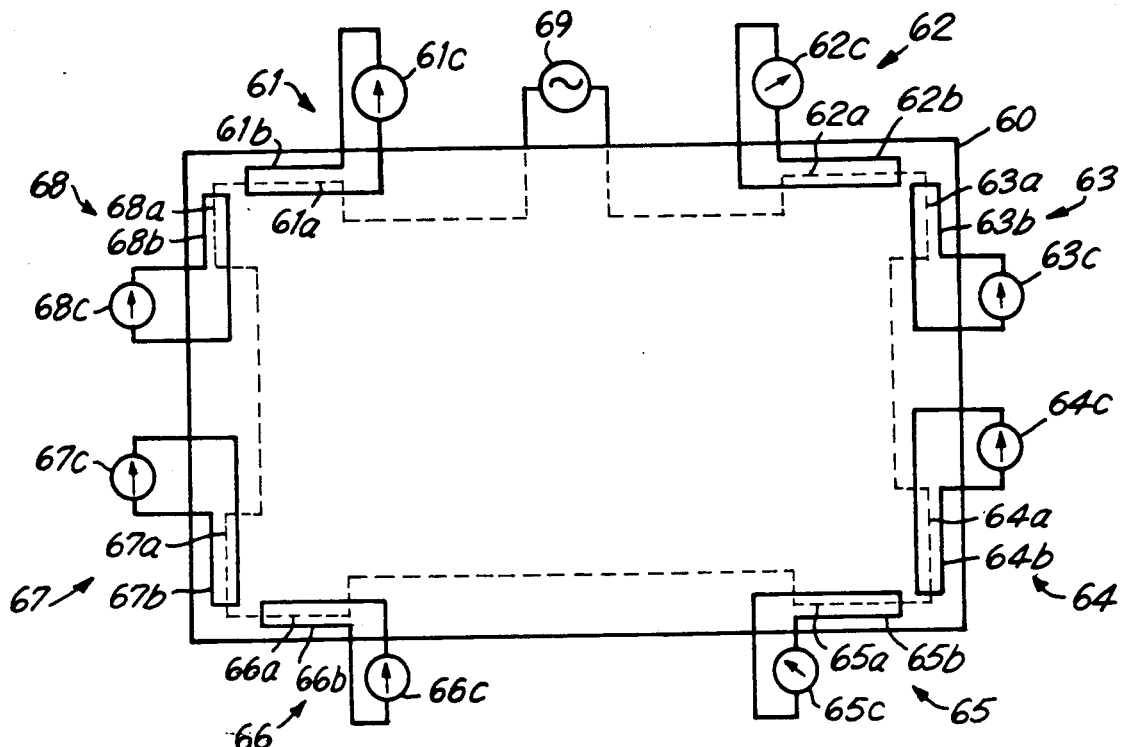
FIG. 10 is an illustration of fifth alternative embodiment including two superimposed flat panels having a plurality of detector coils and serially connected driver coils disposed thereon.

The sensors 61-68 of FIG. 10 include driver coils 61a-68a which are preferably integral parts of the workpiece 60 and which are made during the fabrication of the workpiece. The detector coils 61b-62b can be separately made and mounted on the table at the correct location. For simplicity and to minimize the number of connections, the driver coils 61a-68a are serially connected to form a driver network. The driver network is coupled to a source of alternating current 69. FIG. 10 shows a workpiece 60, e.g. a panel, that has grown wider on the right side, but has retained the correct length and width at the left side. This deformity or distortion could occur during the processing of the panel 60.

The most desirable position of the panel 60 is obtained manually or in the alternative automatically using a servo mechanism. Advantageously, an automatic servomechanism can be used to establish a null reading of feedback displays 61c-68c (since no deviation is necessary) and then to offset the feedback displays 62c and 65c by equal amounts in opposite directions in the event a simultaneous null is not attainable. The effect of offsetting the feedback displays 62c and 65c is to position optimumly the distorted right side of the panel 60.

Figure 11:
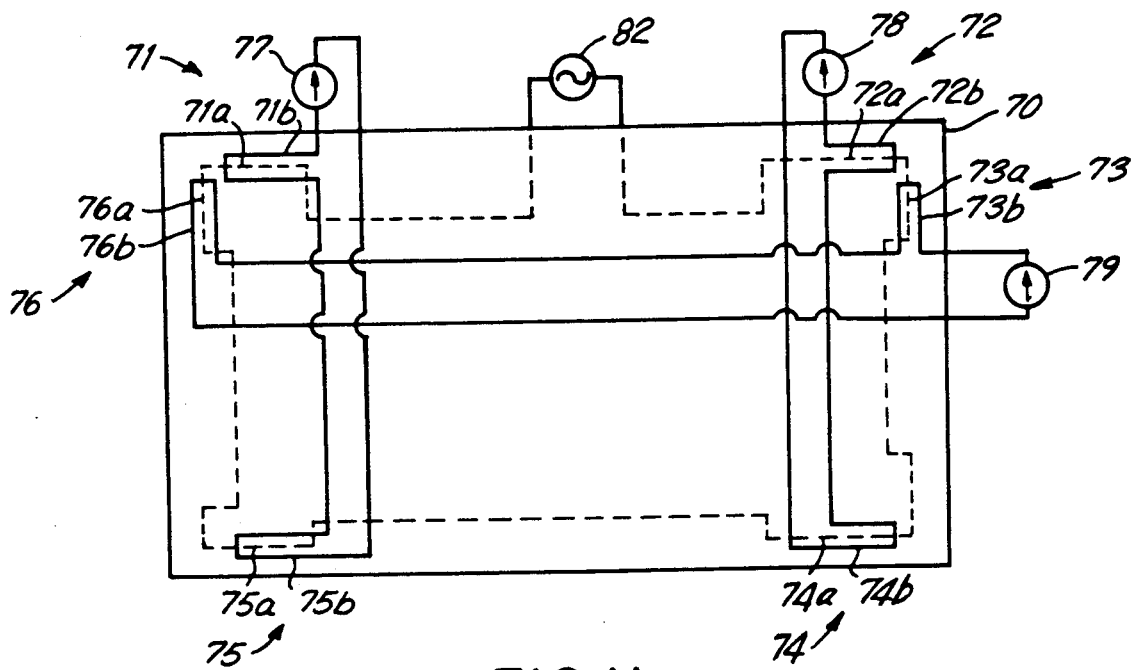
FIG. 11 is an illustration of a sixth alternative embodiment including two superimposed flat panels having a plurality of serially connected pairs of detector coils and serially connected driver coils disposed thereon.

Another similarly distorted panel 70 is illustrated in FIG. 11. In a fourth alternative embodiment for obtaining automatic averaging, the panel 70 includes sensors 71-76 with driver coils 71a-76a formed on the panel and detector coils 71b-76b located on the machine table. An alternating current source 82 is connected to the serially-connected driver coils 71a-76a. The feedback display 77 of serially connected opposing detector coils 71b, 75b will indicate a null condition only when their respective driver coils 71a, 75a are offset by an equal amount in opposite directions. Position error averaging is thus achieved without human intervention or complex instrumentation. The same relationship is true for feedback displays 78, 79 and their respective sets of detector coils 72b, 74b and 73b, 76b.

The techniques described above and illustrated in FIGS. 10 and 11 provide feedback information which is (1) specific to a single vector, (2) direction discriminating, and (3) non-interactive with other vectors. As a result this feedback information is readily usable and very suitable for manual operation or to drive simple servo-mechanisms for automatic operation.

Other modifications of this invention will be readily apparent to those skilled in the art.

In one such modification shrinkage variation is determined and accounted for. A printed circuit panel is provided with multiple etched driver patterns, and the panel is placed on an in-line station with a corresponding array of multiple detector patterns. After the best registration fit of the panel to the in-line detector patterns has been achieved, the tooling holes are drilled. The residual amount of misregistration is due to shrinkage and variation in shrinkage in X, Y and diagonal directions and variations in different portions of the panel. It is contemplated that the misregistration signals from the multiple sensors may be converted to digital data and used in software to modify the hole drilling or panel routing programs to optimize the hole to conductive pattern registration in each individual sector of the board.

Finally, it has been observed that surface mounted components are smaller and need to be more precisely registered to the conductive pattern of a printed circuit board than do through hole mounted components. In yet another modification of this invention, multiple driving patterns are provided on each printed circuit board and a corresponding number of detector patterns are positioned on each station of the component placement machine to permit precise and automatic registration of the board to the component placement head.

While the invention has been described in its preferred embodiments, it is to be understood that the words which have been used are words of description rather than limitation and that change may be made within the purview of the appended claims without departing from the true scope and spirit of the invention in its broader aspects.

We claim:

1. An apparatus for determining the relative position of at least a first object with respect to a second object, the first object being a layer of a circuit board and the second object being a surface associated with a machine for making circuit boards or a second layer of a circuit board, the apparatus comprising:
   a first geometric pattern of conductive material disposed on the first object;
   a second geometric pattern of conductive material which is disposed on the second object in juxtaposition with the first, such that the perpendicular projection of said second geometric pattern on the first object is centered on about said first geometric pattern;
   means for applying a predetermine value of alternating current to said first pattern to establish an electromagnetic field surrounding said first pattern;
   means for detecting the magnitude of the voltage induced in said second pattern by the field established by said first pattern;
   whereby the position of the first object relative to the second object is indicated by the magnitued of the detected voltage resulting from the said predetermined value of alternating current.

2. The apparatus according to claim 1 wherein a predetermined position of the first object relative to the second object is indicated by the peak voltage detected by said detecting means.

3. The apparatus according to claim 1 wherein said second pattern includes two parallel legs connected to each other, said detector means being connected to said legs and a predetermined position of the first object relative to the second object being indicated by a null voltage.

4. The apparatus according to claim 1 wherein said detecting means include an amplifier and a display means connected to said second pattern.

5. The apparatus according to claim 1 wherein said means for applying a predetermined value of alternating current includes an oscillator and an amplifier.

6. The apparatus according to claim 1 further comprising at least two first patterns disposed orthogonally to one another and at least two second patterns disposed orthogonally to one another.

7. The apparatus according to claim 6 wherein the conductive material of said first patterns is an insulated wire which forms a bow-tie shaped pattern having a cross-over point.

8. The apparatus according to claim 7 wherein the second patterns include substantially rectangular shaped coils.

9. The apparatus according to claim 1 wherein the conductive material of said first pattern is a metallic etching which forms a bow-tie shaped pattern not including a cross-over point.

10. The apparatus according to claim 9 wherein the conductive material of said first pattern is conductive ink.

11. The apparatus according to claim 9 wherein said second patterns include substantially rectangular shaped coils having insulated cross over points.

12. The apparatus according to claim 1 wherein a plurality of said first pattern geometric patterns ar disposed around the periphery of the first object and a plurality of said corresponding second patterns are disposed around the periphery of the second object, each of said second patterns having detecting means connected thereto.

13. The apparatus according to claim 1 wherein the first and second objects are layers of a circuit board.

14. A method of establishing the registration of a layer of a discrete wiring board to a surface associated with a wire scribing machine surface which comprises the steps of:
 (a) forming a plurality of first patterns of linear conducting material at a plurality of locations on a panel, said panel being a layer of a discrete wiring board;
 (b) wire scribing a plurality of corresponding second patterns on a surface associated with the wire scribing machine;
 (c) connecting detecting means to said wires second patterns;
 (d) connecting a source of alternating current to said first patterns on said panel;
 (e) translating said panel relative to said surface until said detecting means detects a predetermined condition.

15. A method of establishing at least one wire scribed conductor on a substrate in registration to the conductive pattern of the substrate, which method comprises the steps of:
 a. wire scribing a plurality of first datum reference conductive patterns on a surface associated with and in fixed relation to the table of a wire scribing machine;
 b. connecting detecting means to said first wire scribed pattern;
 c. providing a substrate having a corresponding plurality of second datum reference conductive patterns on an insulating base;
 d. connecting a source of alternating current to said second corresponding datum reference patterns on the insulating base;
 e. placing the insulating base on the table of the wire scribing machine;
 f. moving the insulating base relative to the table in response to signals from said detecting means until optimum registration between said first and second datam reference conductive patterns is obtained;
 g. wire scribing a conductor layer on the substrate.

* * * * *